(12) United States Patent
Pellens

(10) Patent No.: US 7,892,903 B2
(45) Date of Patent: Feb. 22, 2011

(54) DEVICE MANUFACTURING METHOD AND SUBSTRATE COMPRISING MULTIPLE RESIST LAYERS

(75) Inventor: Rudy Jan Maria Pellens, Overpelt (BE)

(73) Assignee: ASML Netherlands B.V., Veldhoven (NL)

( * ) Notice: Subject to any disclaimer, the term of this patent is extended or adjusted under 35 U.S.C. 154(b) by 1458 days.

(21) Appl. No.: 10/783,034

(22) Filed: Feb. 23, 2004

(65) Prior Publication Data

US 2005/0186785 A1    Aug. 25, 2005

(51) Int. Cl.
H01L 21/338    (2006.01)

(52) U.S. Cl. .............................. 438/182; 257/E21.205

(58) Field of Classification Search ................ 430/156, 430/157; 438/142, 167, 180–185, 571; 257/E21.195, 257/E21.205
See application file for complete search history.

(56) References Cited

U.S. PATENT DOCUMENTS

| | | | |
|---|---|---|---|
| 4,567,132 A * | 1/1986 | Fredericks et al. | |
| 5,262,270 A * | 11/1993 | Walls | 430/156 |
| 5,496,770 A * | 3/1996 | Park | 438/613 |
| 5,514,520 A | 5/1996 | Thackeray et al. | |
| 5,543,253 A * | 8/1996 | Park et al. | 430/5 |
| 5,930,610 A * | 7/1999 | Lee | 438/182 |
| 6,042,997 A | 3/2000 | Barclay et al. | |
| 6,063,543 A * | 5/2000 | Hien et al. | |
| 6,090,526 A | 7/2000 | Kumar | |
| 6,255,035 B1 | 7/2001 | Minter et al. | |
| 6,387,783 B1 | 5/2002 | Furukawa et al. | |
| 6,461,717 B1 | 10/2002 | Rutter, Jr. et al. | |
| 6,472,128 B2 | 10/2002 | Thackeray et al. | |
| 6,528,235 B2 | 3/2003 | Thackeray et al. | |
| 6,638,683 B1 * | 10/2003 | Tan et al. | |
| 6,740,535 B2 * | 5/2004 | Singh et al. | 438/18 |
| 6,881,688 B2 * | 4/2005 | Maile | |
| 6,943,068 B2 * | 9/2005 | Chang et al. | 438/167 |
| 6,962,771 B1 * | 11/2005 | Liu et al. | 430/317 |
| 2002/0034872 A1 * | 3/2002 | Kazama et al. | 438/613 |
| 2002/0151156 A1 * | 10/2002 | Hallock et al. | 438/531 |
| 2003/0016270 A1 * | 1/2003 | Kubota et al. | 347/47 |
| 2004/0056304 A1 * | 3/2004 | Ahmed et al. | 257/336 |

FOREIGN PATENT DOCUMENTS

| | | |
|---|---|---|
| EP | 0 903 779 A2 | 3/1999 |
| JP | 1064220 A | 3/1989 |

OTHER PUBLICATIONS

Malik et al., "Polymer Structural Variation Towards Enhancing KrF Resist Lithographic Properties," Journal of Photopolymer Science and Technology, 1998, vol. 11, No. 3, p. 431-438.*

(Continued)

*Primary Examiner*—Sue Purvis
*Assistant Examiner*—Kevin Quinto
(74) *Attorney, Agent, or Firm*—Pillsbury Winthrop Shaw Pittman LLP

(57) ABSTRACT

A method of producing a T-gate in a single stage exposure process using electromagnetic radiation is disclosed.

15 Claims, 4 Drawing Sheets

OTHER PUBLICATIONS

Arch 8250 Marketing Materials, *Arch Chemicals, Inc.*
Arch® 8250-10 Safety Data, *Arch Chemicals, Inc.*, Mar. 28, 2003, pp. 1-7.
GKR-5115 Data Sheet.
GKR-6102 Safety Data, *Arch Chemicals, Inc.*, Apr. 14, 2003, pp. 1-7.
GKR-6203A2 Data Sheet.
S. Malik et al., "Polymer Structural Variation Towards Enhancing KrF Resist Lithographic Properties," The Institution of Electrical Engineers, Journal of Photopolyer Science and Technology Association (Japan), vol. 11 (No. 3), pp. 431-438, (1998).
International Search Report, dated Nov. 4, 2005.
Huong-Ming Lee, et al., New Nanometer T-Gate Fabricated by Thermally Reflowed Resist Technique, Japan Journal of Applied Physics, The Japan Society of Applied Physics, vol. 41 (No. 12B), pp. L1508-L1510, (Dec. 15, 2002).

PCT International Search Report, (dated Nov. 4, 2005).
N. Samoto et al., Sub-0.1-um T-Shaped Gate Fabrication Technology Using Mixing-Layer Sidewalls in a Double-Layer Resist System, J. Vac. Sci Technology, American Vacuum Society, vol. 12 (No. 6), pp. 3673-3676, (Nov./Dec. 1994).
U.S. Appl. No. 11/046,045, filed Jan. 28, 2005.
Arch 8250 Marketing Materials, *Arch Chemics, Inc.*, Jun. 2001.
GKR-6102 Safety Data, *Arch Chemicals, Inc.*, Apr. 14, 2003, pp. 1.7.
Kawabe et al., Development of "GKR Series" KrF Excimer Resists for 130nm Node, Fujifilm Research & Development, 2001, p. 40-43, vol. 47-2002, Shizuoka, Japan.
Office Action in related JP application JP2006-553565 dated Jul. 2, 2010.

* cited by examiner

DEVICE MANUFACTURING METHOD AND SUBSTRATE COMPRISING MULTIPLE RESIST LAYERS

BACKGROUND OF THE INVENTION

1. Field of the Invention

The present invention relates to a device manufacturing method and a substrate for use in the method.

2. Description of the Related Art

A lithographic apparatus is a machine that applies a desired pattern onto a target portion of a substrate. The lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Certain ICs in telecommunications applications comprise a structure known as "T-gates." T-gates are typically required to have gate sizes less than 0.4 µm. GaAs FET performance depends on the gate width which is the short dimension of the gate structure. As the gate length is reduced, gate resistance increases due to the reduced cross-sectional gate area. This increased resistance adversely effects device performance.

Therefore, to decrease the gate resistance and maintain a small gate length, additional gate material is added to the top of the gate feature thereby creating the shape of a "T". This increases the total cross-sectional area without increasing the short dimension of the gate structure. For this reason, T-gates are also sometimes referred to as "mushroom gates". Typical dimensions of a T-gate are a bottom dimension of 0.15–0.25 µm and a top dimension of 0.45–0.75 µm.

Presently T-gates are expensive to manufacture. T-gates can be made by an electron beam process in which a substrate 1 is coated with three layers of polymethylmethacrylate which have different sensitivities to the electron beam radiation, as illustrated in FIG. 2a. The middle layer 102 is the most sensitive, followed by the top layer 103 and then the bottom layer 101 which is closest to the substrate.

When the electron beam PB impinges on these layers (FIG. 2b), and following developing, the middle layer looses the largest portion 120, the top layer looses a slightly smaller portion 130 and thereby overhangs the gap in the middle layer whilst the bottom layer looses the smallest portion 110 as shown in FIG. 2c. Then by depositing a metal layer 140 on the substrate, a T-gate shape 50 is formed (FIG. 2d). Because the gap 120 in the middle layer is larger than the gap 130 in the top layer, there is a gap between the second layer 102 and the deposited metal 140 at the same level as the second layer 102. This allows the removal of the three electron beam radiation sensitive layers by dissolving in a solvent (so called "lift-off")

Unfortunately, electron beam lithography is expensive and, because of the need to write the image, electron beam lithography generally has a low throughput.

SUMMARY OF THE INVENTION

The principles of the present invention, as embodied and broadly described herein, provide a method of fabricating T-gates using optical lithography. In one embodiment, the present invention provides a device manufacturing method comprising: (i) providing a substrate: (ii) providing a first layer of electromagnetic radiation sensitive material on said substrate; (iii) providing a second layer of electromagnetic radiation sensitive material on said first layer of radiation sensitive material, said second layer of radiation sensitive material being of a different material than said first layer of radiation sensitive material; (iv) providing a beam of electromagnetic radiation using an illumination system; (v) imparting said beam of radiation with a desired pattern in its cross-section by employing a patterning device; and (vi) projecting said patterned beam of radiation onto a target portion of said first and second layers of radiation sensitive material.

Thus, using this device manufacturing method, two layers of radiation sensitive material are exposed at the same time using electromagnetic radiation so that a device may be formed in one exposure and processing cycle. Because a patterning device is used many devices may be imaged at once and through put is vastly increased over electron beam T-gate manufacture.

Preferably the first layer of radiation sensitive material has a dose size of at least 1.5 times, preferably 2.0 times and most preferably 2.5 times the magnitude of the dose size of the second layer of radiation sensitive material. In this way, after etching of the irradiated layers of radiation sensitive material, a T-shaped space in the first and second layers of radiation sensitive material is formed such that a T-gate can be deposited onto the substrate. It is advantageous that the first layer is thinner than the second layer so that the correct geometry of T-gate is formed. Preferably the first layer is between 100 and 500 nm thick and the second layer is between 500 and 1500 nm thick.

Although some intermixing of the first and second layers of radiation sensitive material can occur, it is desirable that the first and second materials are substantially immiscible so that there are distinct layers with different radiation sensitivities on the substrate.

If the first and second materials are based on the same or a similar solvent, it has been found that the electromagnetic radiation sensitive layers do not interfere with each other but that they are compatible. A suitable solvent has been found to be bulky-acetal polymers. If the first and second materials have different solvents (but both based on bulky-acetal polymers) the two layers have similar (but not the same) solvent (perhaps a generic solvent) so that they will not dissolve in each other and should not interfere with each other. Suitable materials have been found to be GKRS 6202 for the first layer and ARCH 8250 for the second layer. These materials are available from ARCH Chemicals N.V., Zwijndrecht, Belgium. These materials are both positive photoresists.

After exposure, the portions of the layers of radiation sensitive material which have been exposed can be developed away. Preferably the portion of the first layer is less than the portion of the second layer so that a T-gate shape gap is left. It is advantageous that after development, the second layer overhangs the first layer at its edges. If this can be arranged, only a single metal need be deposited on the substrate to form a T-gate with a gap for solvent between the second layer of electromagnetic radiation sensitive material and the metal layer adjacent to the second layer.

Alternatively, a second and optionally a third layer of metal can be deposited onto the substrate. Each successive metal layer will overhang the last layer a little more such that the above mentioned gap can be formed. Preferably a layer of titanium is deposited first, followed by a layer of platinum and a final layer of gold.

Even without overhangs in the second material, the T-gate can be formed by deposition of only a single layer of metal. This can be achieved by evaporation, for example of gold, which as it deposits on the top layer of material beings to overhang itself such that a gap at the level of the second layer between the second layer and the metal is formed.

According to a further aspect of the invention, there is provided a substrate for use in an electromagnetic lithographic projection apparatus, the substrate having a first layer of electromagnetic radiation sensitive material attached to a surface and a second layer of electromagnetic radiation sensitive material attached to said first layer of radiation sensitive material; said first layer of radiation sensitive material being of a different material to said second layer of radiation sensitive material.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm).

The term "patterning device" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
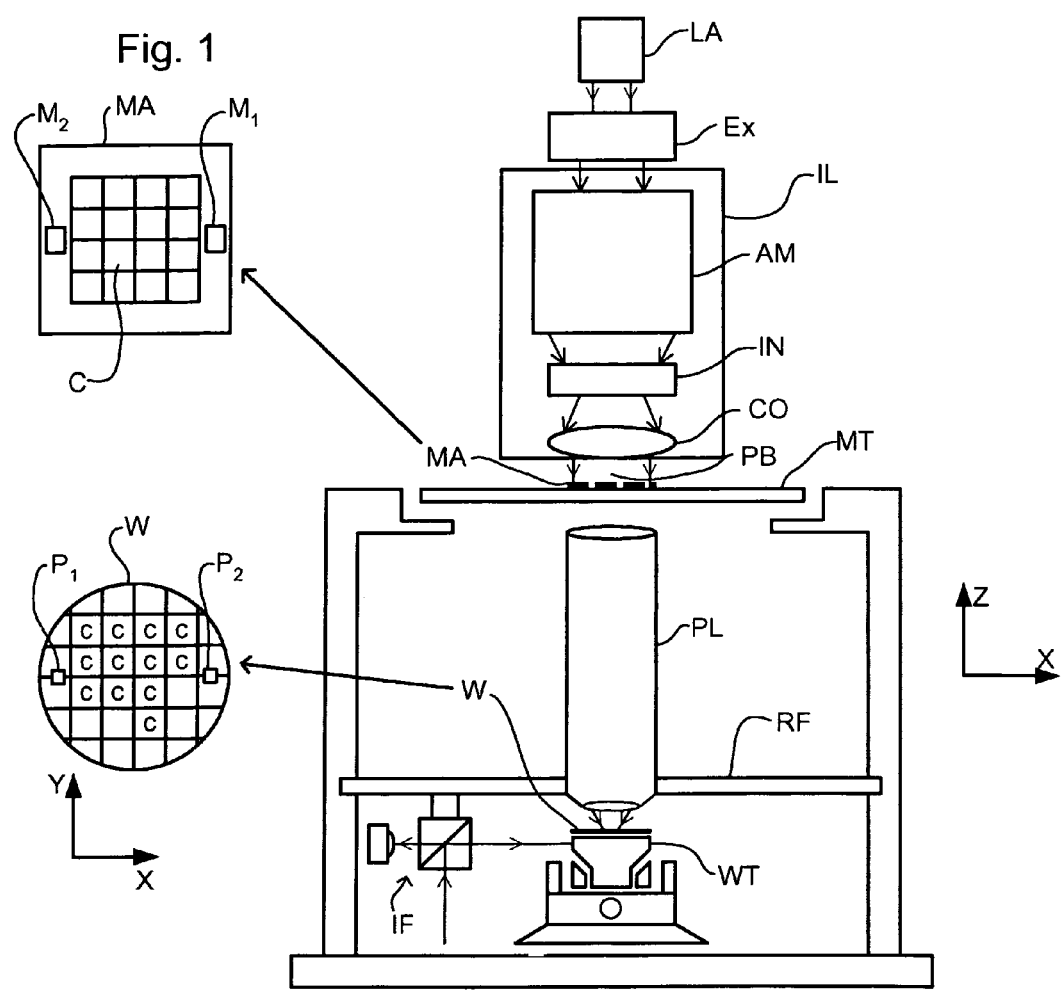
FIG. 1 depicts a lithographic apparatus which may be used to carry out the invention.

FIG. 1 schematically depicts a lithographic apparatus according to a particular embodiment of the invention. The apparatus comprises:

an illumination system (illuminator) IL: for providing a projection beam PB of radiation (e.g. UV radiation or DUV radiation);

a first support structure (e.g. a mask table/holder) MT: for supporting patterning device (e.g. a mask) MA and connected to first positioning mechanism PM for accurately positioning the patterning device with respect to item PL;

a substrate table/holder (e.g. a wafer table) WT: for holding a substrate (e.g. a resist-coated wafer) W and connected to second positioning mechanism PW for accurately positioning the substrate with respect to item PL; and a projection system (e.g. a refractive projection lens) PL: for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator L receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting mechanism AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning mechanism PW and position sensor IF (e.g. an interferometric device), the substrate table WT can be moved accurately, e.g. so as to position different target portions C in the path of the beam PB.

Similarly, the first positioning mechanism PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module and a short-stroke module, which form part of the positioning mechanism PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments

Figure 3:
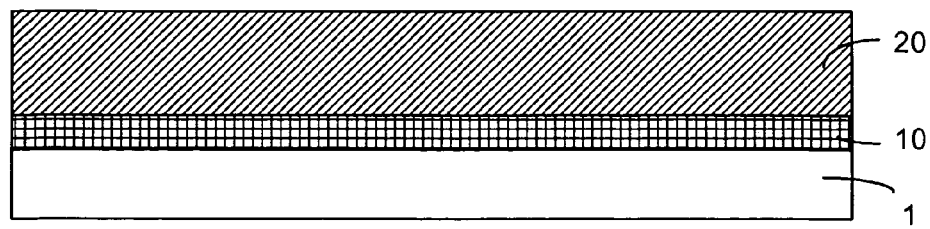
FIG. 3 illustrates a substrate, before exposure, according to the present invention.

FIG. 3 illustrates a substrate 1 according to the present invention. The substrate may, for example, be GaAs, Si, GaN, InP, SiGa etc. A first layer 10 of electromagnetic radiation sensitive material is provided on the top surface of the substrate 1. The first layer 10 can be spin coated at high speed onto the top surface of the substrate 1 to ensure that it is evenly coated. After coating, the substrate is baked. The thickness of the first layer 10 is preferably 200 nm but can be any size. The range of 100–500 nm is preferred.

A second layer 20 of electromagnetic radiation sensitive material is provided on top of the first layer 10 of electromagnetic radiation sensitive material. The second layer is preferably 700 nm thick. Other thicknesses can of course be used and the preferable range is from 500–1500 nm thick. The second layer is applied to the first layer 10 in the same way that the first layer 10 is applied to the substrate 1.

Both the first layer 10 and the second layer 20 of electromagnetic radiation sensitive materials are preferably sensitive to DUV radiation i.e. radiation of about 248 nm wavelength or less. Preferably both are positive resists meaning that those areas which are exposed to radiation can be removed on development. Alternatively, both may be negative resists.

Preferably there is little intermixing between the first layer 10 and the second layer 20 of radiation sensitive material. They may of course be a small thickness between the two layers which is intermixed. However, the difficulty is in finding two materials which do not dissolve in each other but do adhere to each other. Of course it is not possible to use a blocking layer, as will be seen below, because it is necessary for the radiation to expose both the first layer and the second layer in one go.

It has been found that if the first layer 10 and the second layer 20 of electromagnetic radiation sensitive material have similar, but not the same solvent, for example the same generic solvent, the desired properties are achieved. One example which has been found to be suitable is materials based on bulky-acetal polymers. If different bulky-acetal polymers are used in each of the first and second layers 10, 20, then the desired properties are achieved.

Figure 4:
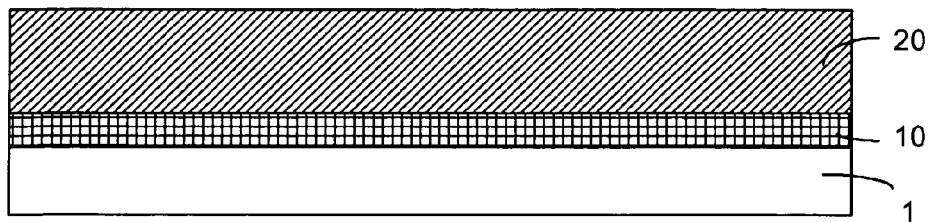
FIG. 4 illustrates a substrate during exposure.

Once the substrate has been prepared, it is exposed to a patterned beam of electromagnetic radiation PB. This radiation is effective to expose the first layer and the second layer 20 in a single exposure step (FIG. 4).

The material of the first layer and second layer is chosen such that the layers have different sensitivities to the electromagnetic radiation. For example, the second layer 20 of electromagnetic radiation preferably has a threshold or dose size of 30 MJ whereas the threshold or dose size for the first layer 10 is only 100 MJ. Thus, a dose size ratio of 1.5, 2.0 or at least 2.5 is preferable. This choice depends, in part, upon the desired geometry of the T-gate.

Suitable materials for the first layer 10 include GKRS 6202 and for the second layer 20 of electromagnetic radiation sensitive material ARCH 8250. Both of these materials are available from ARCH Chemicals N.V., Zwijndrecht, Belgium.

Figure 5:
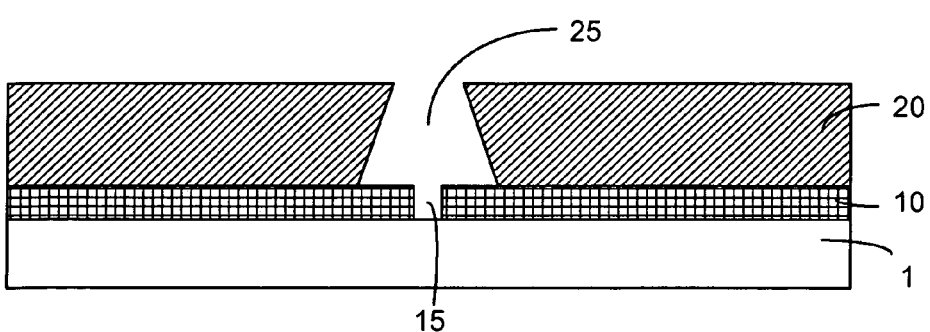
FIG. 5 illustrates a substrate after development according to the present invention.
Figure 7:
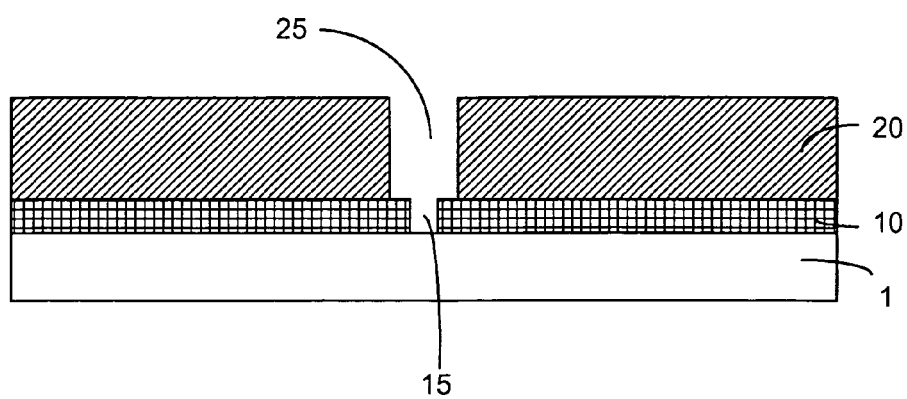
FIG. 7 illustrates another substrate after development according to the present invention.

After exposure to the electromagnetic radiation PB the substrate is developed for example in TMAH OPD 4262. The exposed portions are removed. Typical resulting profiles are illustrated in FIGS. 5 and 7. As can be seen in FIG. 5, the portion of the second layer 20 which is removed by the developer is far greater and in particular far wider than the portion 15 removed from the first layer 10. In both cases (FIGS. 5 and 7), the bottom dimension is about 200 nm wide which is roughly the preferred width at the bottom of a T-gate.

In the situation illustrated in FIG. 5, the portion 25 removed from the second layer 20 is wedge shaped so that parts of the second layer 20 furthest from the substrate 1 overhang the substrate. In lithography this is termed a negative slope and occurs with certain types of resist. An advantage of using this type of resist is that the T-gate can then be formed in a single deposition step.

Figure 2A:
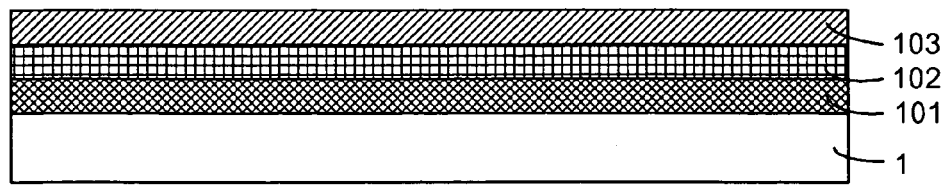
FIG. 2 illustrates a prior art electron beam manufacturing process for making a T-gate.
Figure 2B:
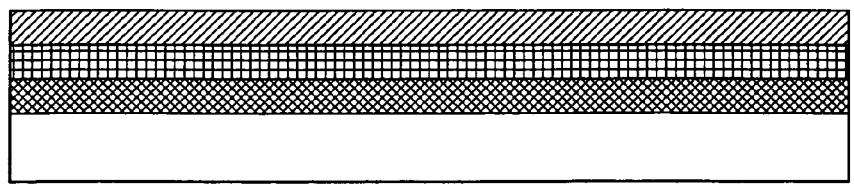
Figure 2C:
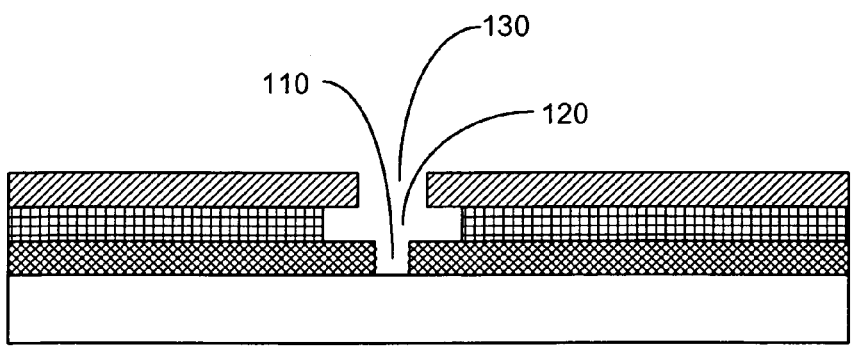
Figure 2D:
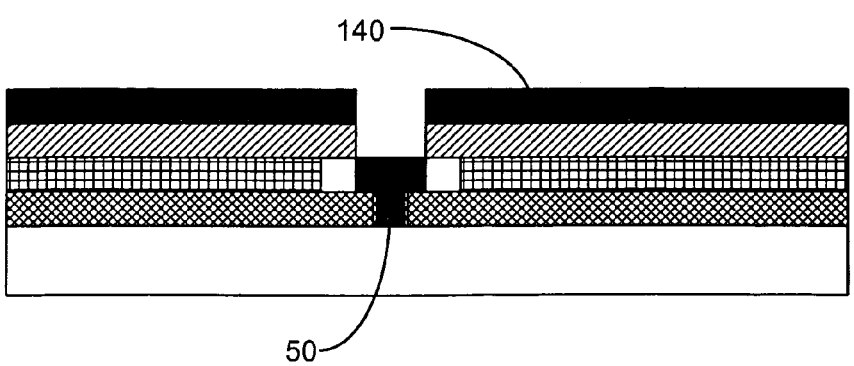
Figure 2E:
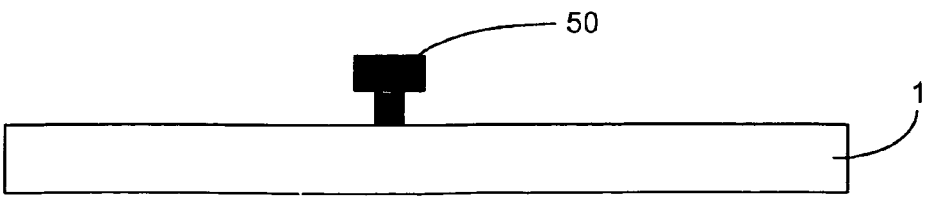
Figure 6:
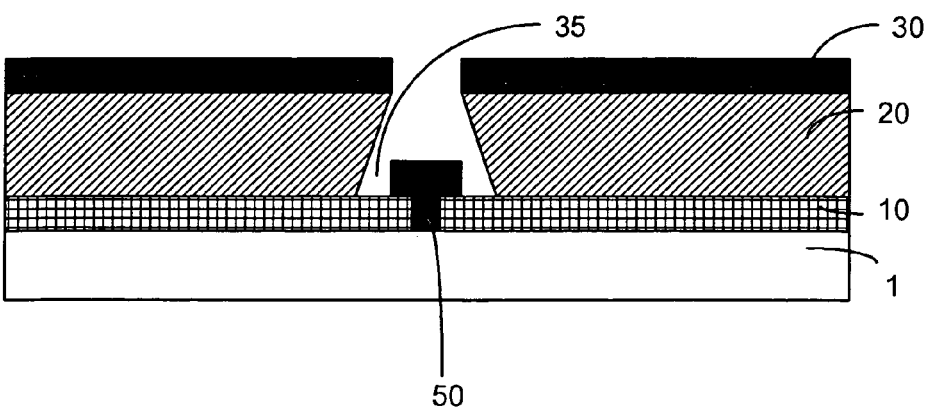
FIG. 6 illustrates the substrate of FIG. 5 after deposition of a layer of metal.

As is illustrated in FIG. 6, when a metal layer 30 is deposited on the structure illustrated in FIG. 5, a T-gate 50 is formed on the substrate 1. A feature is that the sides of the thickest part of the T-gate and level with the second layer 20 of radiation sensitive material are spaced away from the sides of the remaining second layer 20. Thus, there is a lateral gap 35 between the metal layer 30 and the second layer 20. The lateral gap 35 is important because it allows solvent to attack the first layer 10 during lift-off which follows deposition. The presence of that gap 35 is the direct result of the negative slope of the developed second layer 20. After lift-off the metal layer 30 deposited on the second layer, the second layer 20 and the first layer 10 are removed to leave a T-gate 50 on the substrate 1 as is shown in FIG. 2e.

If the second layer 20 of electromagnetic radiation sensitive material does not exhibit negative slope, after developing, the structure remaining is as illustrated in FIG. 7. With this structure it is still possible to simply deposit one metal layer onto the substrate 1. If done by evaporation, for example, this leaves a lateral gap 35 between the top part of the T-gate 50 and the second layer 20 because the gold as it deposits overhangs removed portion 25. As described above, without such a gap 35 it is not possible to remove the first layer 10 of electromagnetic radiation sensitive material.

Figure 8:
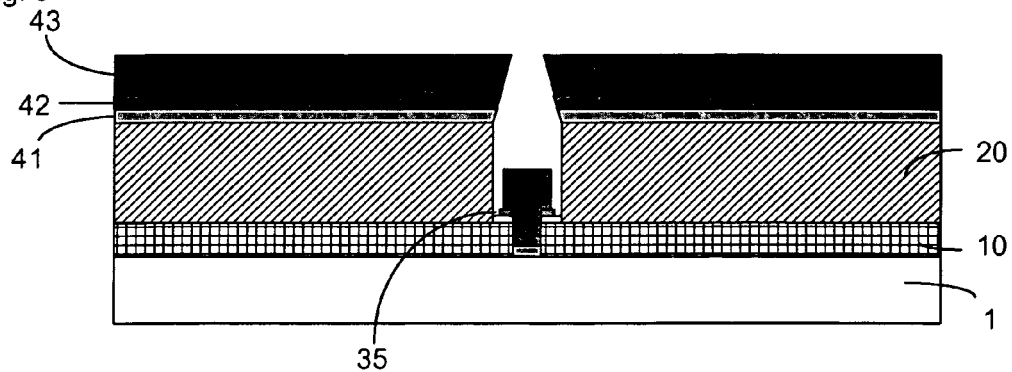
FIG. 8 illustrates the substrate of FIG. 7 after deposition steps of the present invention.

As is illustrated in FIG. 8, a two or preferably a three stage metal deposition step may also be performed. A first layer of metal 41, preferably titanium or platinum and of a thickness of one to a few hundred Angstroms is deposited on the substrate 1. This layer 41 slightly overhangs the removed portion 25 in the second layer 20 of electromagnetic radiation sensitive material. After this layer 41 has been deposited, a second layer may be deposited on the substrate 1. Because of the overhanging nature of the first metal layer 41, the second metal layer 42, 43 will then not touch the sides of the second layer 20 of electromagnetic radiation sensitive material leaving a lateral gap 35.

Preferably the second layer 42 is comprised of platinum or gold. Most preferably a third layer 43 of metal is deposited on the substrate after the first and second layers. The final layer 42, 43 is preferably gold. Titanium and platinum have suitable properties as first and second metal layers for a T-gate, including good adhesion to the substrate. A three layer metal structure comprising first Ti, then Pt and finally Au is preferred. The total thickness of deposited (e.g. by evaporation) metal should be at least the thickness of the first layer 10 of radiation sensitive material and less than the combined thicknesses of the first 10 and second 20 layers of radiation sensitive material, preferably at least 25% less so that a gap large enough for solvent to pass through for dissolution is left between the metal and the second layer.

The final stage for the structure shown in FIG. 8 is a lift-off process which is successful because the top part of the T-gate does not contact laterally with the second layer 20 of radiation sensitive material. A suitable solvent is NMP.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A device manufacturing method comprising:
   providing a substrate;
   providing a first layer of electromagnetic radiation sensitive material on said substrate;
   providing a second layer of electromagnetic radiation sensitive material on said first layer of radiation sensitive material, the first and second layers of electromagnetic radiation sensitive material having a same tonality, said second layer of radiation sensitive material being of a different material than said first layer of radiation sensitive material, said first layer of radiation sensitive material having a dose size of at least approximately 1.5 times the magnitude of a dose size of said second layer of radiation sensitive material;
   providing a beam of electromagnetic radiation using an illumination system;
   imparting said beam of radiation with a desired pattern in its cross-section by employing a patterning device;
   projecting said patterned beam of radiation onto a target portion of said substrate to expose both said first and second layers of radiation sensitive material; and developing said first and second layers of radiation sensitive material to remove portions which have been exposed, wherein said second layer overhangs said first layer after developing.

2. The device manufacturing method of claim 1, wherein said first layer of radiation sensitive material has a dose size of approximately 1.5 times to 2.5 times the magnitude of the dose size of said second layer of radiation sensitive material.

3. The device manufacturing method of claim 1, wherein said first layer is thinner than said second layer.

4. The device manufacturing method of claim 1, wherein said first layer is between 100 and 500 nm thick and said second layer is between 500 and 1500 nm thick.

5. The device manufacturing method of claim 1, wherein said first and second materials are substantially immiscible.

6. The device manufacturing method of claim 1, wherein said first and second materials are based on bulky-acetal polymers.

7. The device manufacturing method of claim 1, wherein said first and second materials have different solvents.

8. The device manufacturing method of claim 1, wherein said first and second layer materials are positively radiation sensitive.

9. The device manufacturing method of claim 1, wherein said removed portion of said first layer is smaller than said removed portion of said second layer.

10. The device manufacturing method of claim 1, wherein said substrate comprises GaAs, Si, GaN, InP, or SiGa.

11. The device manufacturing method of claim 1, wherein said method is a process for the manufacture of an integrated circuit having a T-gate.

12. A device manufacturing method comprising:
providing a substrate;
providing a first layer of electromagnetic radiation sensitive material on said substrate;
providing a second layer of electromagnetic radiation sensitive material on said first layer of radiation sensitive material, the first and second layers of electromagnetic radiation sensitive material having a same tonality, said second layer of radiation sensitive material being of a different material than said first layer of radiation sensitive material, said first layer of radiation sensitive material having a dose size of at least approximately 1.5 times the magnitude of a dose size of said second layer of radiation sensitive material;
providing a beam of electromagnetic radiation using an illumination system;
imparting said beam of radiation with a desired pattern in its cross-section by employing a patterning device;
projecting said patterned beam of radiation onto a target portion of said substrate to expose both said first and second layers of radiation sensitive material;
developing said first and second layers of radiation sensitive material to remove portions which have been exposed;
depositing a first layer of metal onto said substrate;
lifting off said first and second layers of radiation sensitive material to leave a T-gate on said substrate; and
before said lifting off, depositing a second layer of metal onto said substrate.

13. The device manufacturing method of claim 12, wherein said first layer of metal comprises Ti or Pt and said second layer comprises Pt or Au.

14. The device manufacturing method of claim 12, further comprising depositing a third layer of metal onto said substrate.

15. The device manufacturing method of claim 14, wherein said third layer of metal comprises Au.

\* \* \* \* \*